(12) United States Patent
Koo et al.

(10) Patent No.: US 8,101,445 B2
(45) Date of Patent: Jan. 24, 2012

(54) THIN FILM TRANSISTOR ARRAY PANEL AND METHOD FOR MANUFACTURING THE SAME

(75) Inventors: Bon-Yong Koo, Asan-si (KR); Bae-Heuk Yim, Asan-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 231 days.

(21) Appl. No.: 12/496,101

(22) Filed: Jul. 1, 2009

(65) Prior Publication Data

US 2010/0187538 A1    Jul. 29, 2010

(30) Foreign Application Priority Data

Jan. 29, 2009  (KR) .................. 10-2009-0007142

(51) Int. Cl.
 *H01L 21/336* (2006.01)
(52) U.S. Cl. .................. 438/30; 257/E21.414
(58) Field of Classification Search .......... None
See application file for complete search history.

(56) References Cited

U.S. PATENT DOCUMENTS

| | | | | |
|---|---|---|---|---|
| 7,593,084 | B2 * | 9/2009 | Nam et al. ............ | 349/141 |
| 7,968,385 | B2 * | 6/2011 | Jeong et al. .......... | 438/154 |
| 2005/0248708 | A1 * | 11/2005 | Park et al. ........... | 349/149 |
| 2007/0052895 | A1 | 3/2007 | Chen | |
| 2007/0182909 | A1 | 8/2007 | Kim | |
| 2007/0252142 | A1 * | 11/2007 | Yoon ................. | 257/40 |
| 2008/0018850 | A1 | 1/2008 | Shih | |
| 2008/0042133 | A1 * | 2/2008 | Chin et al. .......... | 257/59 |
| 2010/0148182 | A1 * | 6/2010 | Chin et al. .......... | 257/72 |
| 2011/0079776 | A1 * | 4/2011 | Choi et al. .......... | 257/43 |

FOREIGN PATENT DOCUMENTS

| | | |
|---|---|---|
| JP | 2005-165286 | 6/2005 |
| JP | 2007-334281 | 12/2007 |
| JP | 2008-165242 | 7/2008 |
| KR | 10-2008-0048235 | 6/2008 |
| KR | 10-2008-0055314 | 6/2008 |
| KR | 10-2008-0062585 | 7/2008 |
| KR | 10-2008-0063553 | 7/2008 |
| KR | 10-2008-0076360 | 8/2008 |

* cited by examiner

*Primary Examiner* — Benjamin Sandvik
(74) *Attorney, Agent, or Firm* — H.C. Park & Associates, PLC

(57) ABSTRACT

A thin film transistor array panel according to the present invention includes: an insulation substrate having a display area and a peripheral area; a plurality of thin film transistors disposed in the display area; a plurality of gate lines connected to the thin film transistors; a plurality of data lines connected to the thin film transistors; a driving unit disposed in the peripheral area of the insulation substrate, and controlling the thin film transistor; a plurality of signal lines connecting between the driving unit and the gate lines or the data lines; and a dummy pattern overlapping the signal line and made of a transparent conductive material.

6 Claims, 14 Drawing Sheets

THIN FILM TRANSISTOR ARRAY PANEL AND METHOD FOR MANUFACTURING THE SAME

CROSS-REFERENCE TO RELATED APPLICATION

This application claims priority from and the benefit of Korean Patent Application No. 10-2009-0007142, filed on Jan. 29, 2009, which is hereby incorporated by reference for all purposes as if fully set forth herein.

BACKGROUND OF THE INVENTION

1. Field of the Invention

The present invention relates to a thin film transistor array panel and a manufacturing method thereof.

2. Discussion of the Background

A liquid crystal display (LCD) is one of the most commonly used flat panel displays, and it includes two substrates with electrodes formed thereon and a liquid crystal layer interposed between the two substrates. In the LCD, a voltage is applied to the electrodes to realign liquid crystal molecules of the liquid crystal layer to thereby regulate the transmittance of light passing through the liquid crystal layer.

As one of two display panels of the liquid crystal display, a thin film transistor (TFT) display panel is used as a circuit board for independently driving pixels in the liquid crystal display. The TFT display panel may also be used as a circuit board for independently driving pixels in an organic electro luminescence (EL) display device.

The thin film transistor array panel includes a signal wire or a gate wire transmitting a scanning signal, an image signal line or a data wire transmitting an image signal, a thin film transistor connected to the gate wire and the data wire, a pixel electrode connected to the thin film transistor, a gate insulating layer covering the gate wire for insulating, and an interlayer insulating layer covering the thin film transistor and the data wire.

The thin film transistor array panel connected to the gate wire and the data wire is controlled by a driving circuit.

This driving circuit is connected to the gate wire or the data wire formed in the display area including the pixels through signal lines, and the signal lines are densely formed in a narrow region for connection along with the driving circuit.

The line interval of the gate wire and the data wire formed in the display area has a width that is determined according to the size of the pixel such that they have a larger width than that of the signal line. That is, the line interval of the signal line is increased from the driving circuit to the display area.

On the other hand, a plurality of photolithography processes are required to form the thin film transistor, however the manufacturing cost increases according to the number of photolithography processes. Accordingly, a process using three masks has been developed to reduce the number of photolithography processes.

In the three mask process, the pixel electrode is formed through a lift-off method, however the insulating layer between the signal lines must be removed in a fan-out portion where the signal lines are aggregated densely such that the interval between the signal lines must be increased.

SUMMARY OF THE INVENTION

Exemplary embodiments of the present invention provide a reduced interval between the signal lines in the fan-out portion of a thin film transistor array panel.

Exemplary embodiments of the present invention also provide a reduced interval between the signal lines in the fan-out portion while forming the thin film transistor through the lift-off method for a simplification of the thin film transistor array panel manufacturing process.

Exemplary embodiments of the present invention also provide a method of manufacturing the thin film transistor array panel with a reduced number of masks.

Additional features of the invention will be set forth in the description which follows, and in part will be apparent from the description, or may be learned by practice of the invention.

An exemplary embodiment of the present invention discloses a thin film transistor array panel including an insulation substrate having a display area and a peripheral area and a plurality of thin film transistors disposed in the display area. A plurality of gate lines are connected to the thin film transistors and a plurality of data lines are also connected to the thin film transistors. A driving unit is disposed in the peripheral area of the insulation substrate, to control the thin film transistors. A plurality of signal lines are connected between the driving unit and the gate lines or the data lines. A dummy pattern overlaps the signal lines and is made of a transparent conductive material.

An exemplary embodiment of the present invention also discloses a thin film transistor array panel including a substrate and a gate line, which includes a gate electrode, disposed on the substrate. A gate insulating layer is disposed on the gate line. A semiconductor is disposed on the gate insulating layer. A data line, which includes a source electrode, is disposed on the semiconductor. A drain electrode is also on the semiconductor and faces the source electrode. A passivation layer is disposed on the data line and the drain electrode. A pixel electrode is disposed on the passivation layer and connected to the drain electrode. A sacrificial layer pattern is disposed on the passivation layer and encloses the pixel electrode, thereby defining a pixel.

An exemplary embodiment of the present invention also discloses a manufacturing method of a thin film transistor array panel including forming a gate line and a first signal line for connecting the gate line to a driving circuit on a substrate. Forming a semiconductor on the gate line. Forming a data line and a drain electrode on the semiconductor. Forming a second signal line to connect the data line to the driving circuit. Forming a passivation layer and a sacrificial layer on the data line, the drain electrode, the first signal line, and the second signal line. Forming a photosensitive film pattern including a first portion and a second portion having different thicknesses on the sacrificial layer. Etching the sacrificial layer and the passivation layer by using the photosensitive film pattern as a mask to form a contact hole exposing the drain electrode. Removing the exposed sacrificial layer after removing the first portion of the photosensitive film pattern, and forming an undercut under the second portion of the photosensitive film pattern. Forming a transparent conductive layer on the second portion of the photosensitive film pattern, the exposed drain electrode and the passivation layer. Removing the second portion of the photosensitive film pattern disposed under the transparent conductive layer thereby removing the transparent conductive layer disposed on the second portion of the photosensitive film pattern among the transparent conductive layer to form a pixel electrode and a dummy pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
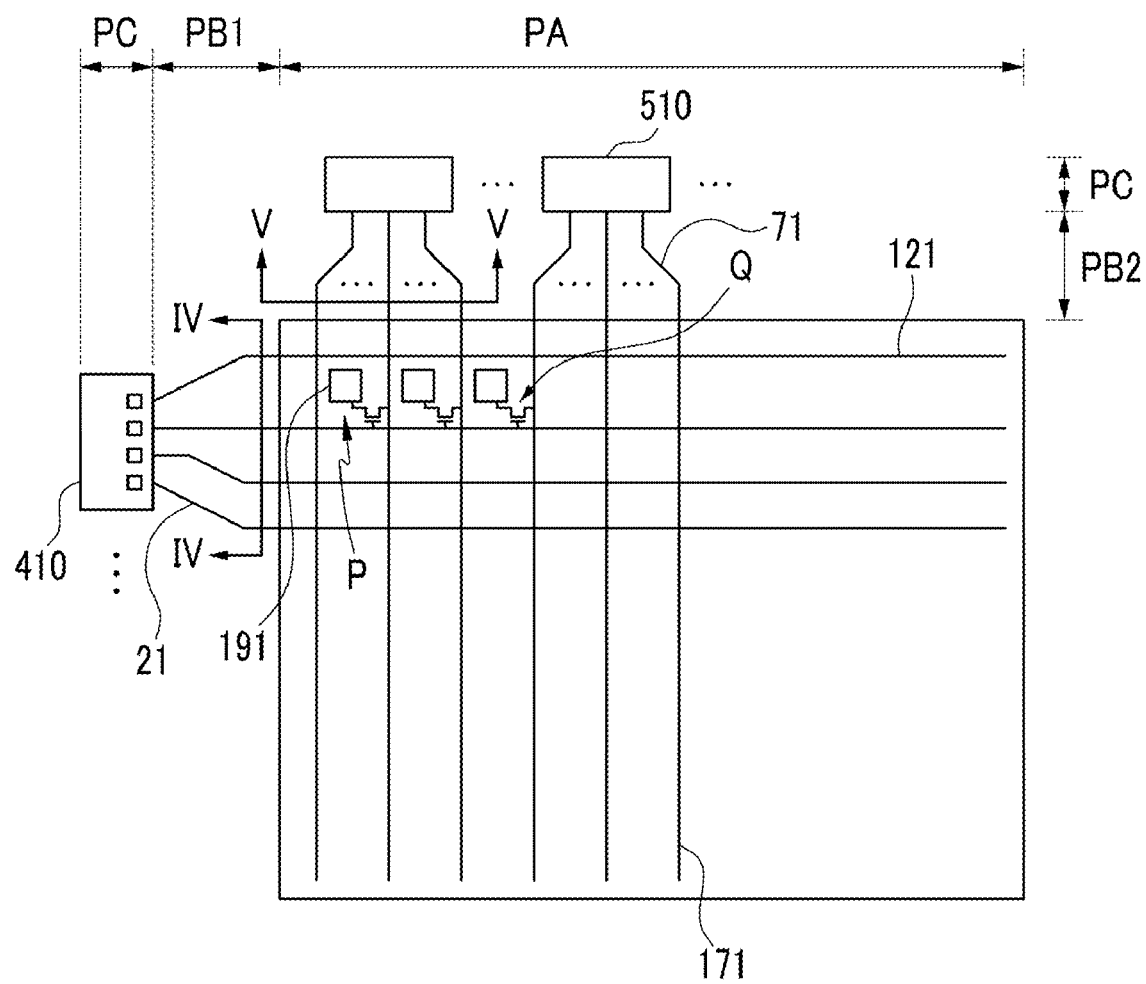
FIG. 1 is a layout view of a thin film transistor array panel according to an exemplary embodiment of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a layout view of a thin film transistor array panel according to an exemplary embodiment of the present invention.

As shown in FIG. 1, a display area PA, a driving unit PC, and a first fan-out portion PB1 and a second fan-out portion PB2 connecting the display area PA to the driving unit PC are formed on a transparent insulation substrate 110. The region bordering the display area PA where the driving unit PC and the first fan-out portion PB1 and the second fan-out portion PB2 are disposed is a peripheral area.

Formed in the display area PA are gate lines 121 transmitting scanning signals and extending in one direction and data lines 171 defining pixels P by crossing the gate lines 121 and transmitting image signals. Pixel electrodes 191 are disposed in the pixels P arranged in a matrix shape and made of a transparent conductive material such as ITO (indium tin oxide) or IZO (indium zinc oxide). Thin film transistors Q are disposed on portions where the gate lines 121 and the data lines 171 cross and are electrically connected to the gate lines 121 and the data lines 171, thereby controlling the image signals transmitted to the pixel electrodes 191 according to the scanning signals.

In the driving unit PC, a data driving circuit 510 and a gate driving circuit 410 are formed connected to the data lines 171 and the gate lines 121, respectively, and transmitting external signals. The data driving circuit 510 and the gate driving circuit 410 may be mounted on the substrate 110 as an integrated circuit (IC) chip, or may be integrated along with the thin film transistor Q.

The first fan-out portion PB1 and the second fan-out portion PB2 as the portion of the gate lines 121 and the data lines 171, respectively, are disposed outside of the display area PA and connect between the driving circuit 410 and 510 and the display area PA of the gate lines 121 and the data lines 171.

Next, the thin film transistor array panel according to an exemplary embodiment of the present invention will be described in detail with reference to FIG. 1, FIG. 2, FIG. 3, FIG. 4 and FIG. 5.

Figure 2:
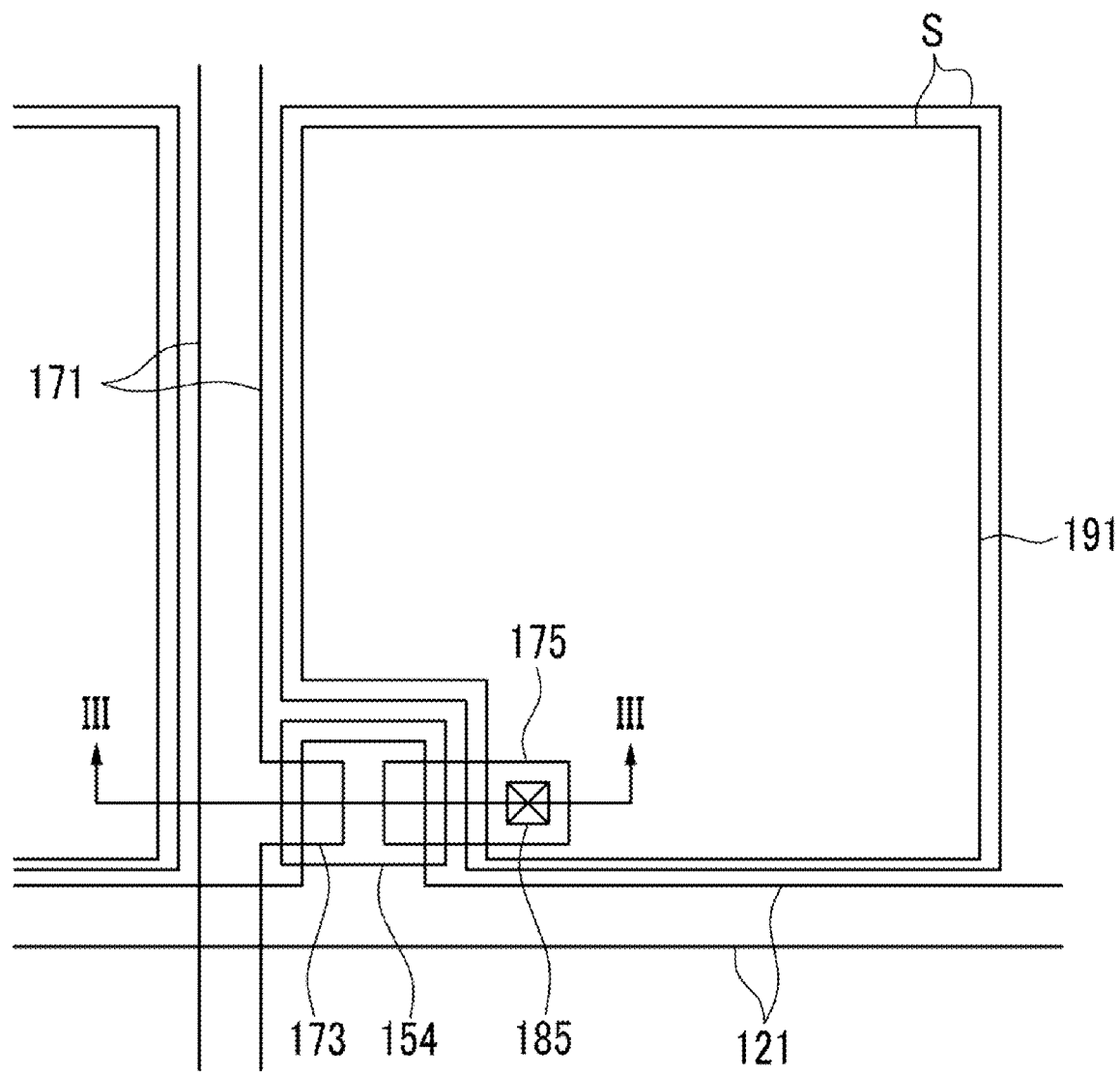
FIG. 2 is a layout view of a pixel of a thin film transistor array panel according to an exemplary embodiment of the present invention.
Figure 3:
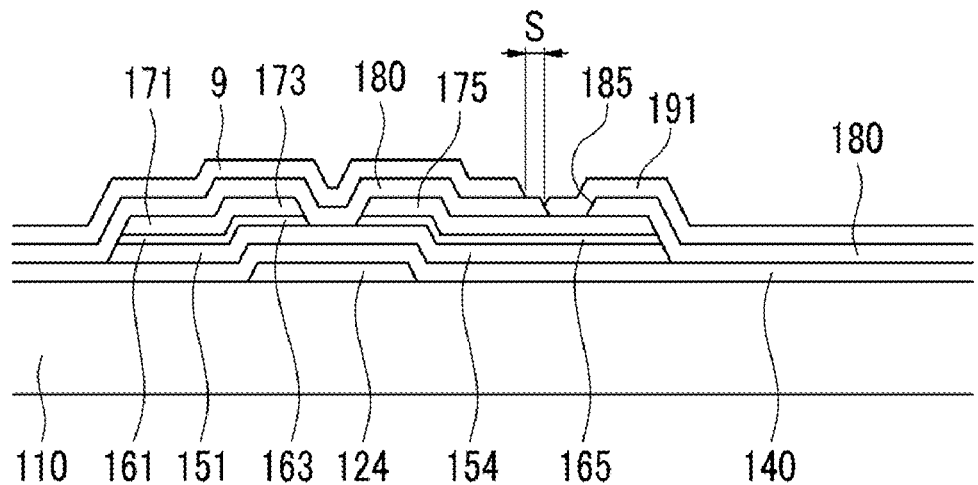
FIG. 3 is a cross-sectional view taken along line III-III of FIG. 2.
Figure 4:
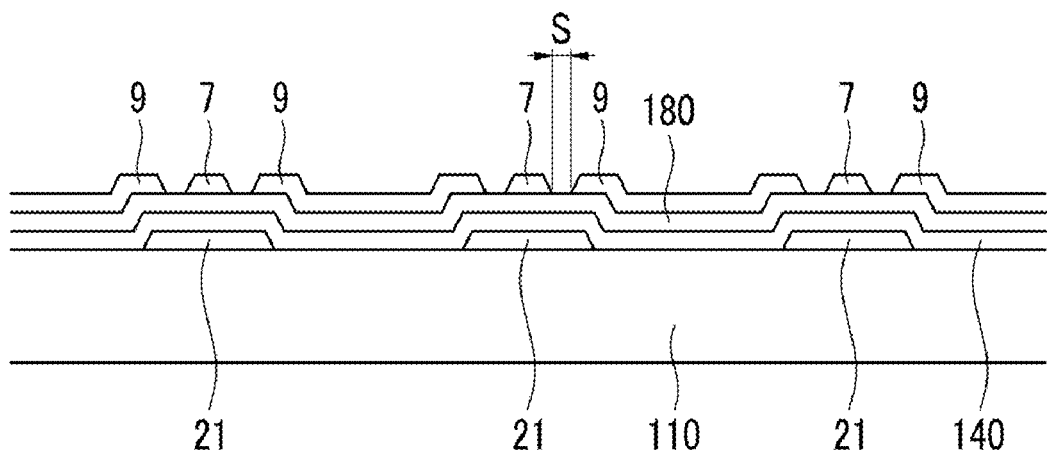
FIG. 4 is a cross-sectional view taken along line IV-IV of FIG. 1.
Figure 5:
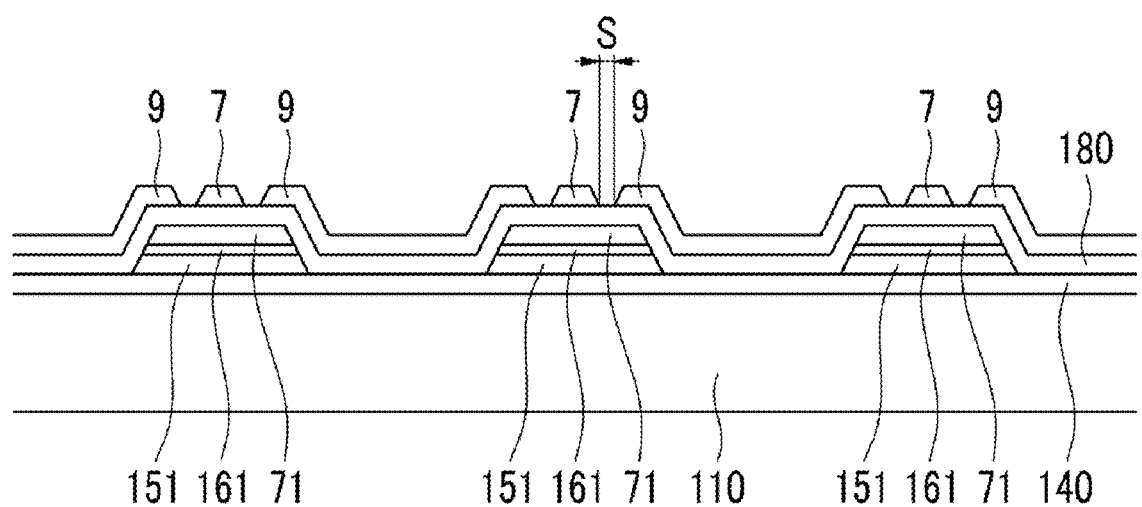
FIG. 5 is a cross-sectional view taken along line V-V of FIG. 1.

FIG. 2 is a layout view of one pixel of a thin film transistor array panel according to the present invention, FIG. 3 is a cross-sectional view taken along line III-III of FIG. 2, FIG. 4 is a cross-sectional view taken along line IV-IV of FIG. 1, and FIG. 5 is a cross-sectional view taken along line V-V of FIG. 1.

Referring to FIG. 1, FIG. 2, FIG. 3, FIG. 4 and FIG. 5, a plurality of gate lines 121 are formed on an insulating substrate 110 made of transparent glass, plastic, etc.

The gate lines 121 transmit gate signals and extend in a transverse direction. Each of the gate lines 121 includes a plurality of gate electrodes 124 protruding from the gate line 121, and an end portion (not shown) having a wide area for connecting to other layers or an external driving circuit such as the gate driving circuit 410. The end portion of the gate line 121 and the gate line 121 of the display area PA are connected to each other through a first signal line 21 forming the first fan-out portion PB1.

A gate insulating layer 140 made of silicon nitride (SiNx) or silicon oxide (SiOx) is formed on the gate line 121, the gate electrode 124, and the first signal line 21.

A plurality of semiconductor stripes 151 that are made of hydrogenated amorphous silicon (a-Si is an abbreviation for amorphous silicon), polysilicon, or so on are formed on the gate insulating layer 140. The semiconductor stripes 151 extend in the longitudinal direction and include a plurality of projections 154 that are extended toward the gate electrodes 124.

A plurality of ohmic contact stripes 161 and a plurality of ohmic contact islands 165 are formed on the semiconductor stripes 151. The ohmic contact stripes 161 and the ohmic contact islands 165 may be made of a material such as n+ hydrogenated amorphous silicon in which an n-type impurity such as phosphor is doped with a high density, or may be made of silicide. The ohmic contact stripes 161 include a plurality of projections 163, and the projections 163 and the ohmic contact islands 165 are disposed as pairs on the projections 154 of the semiconductor stripes 151.

A plurality of data lines 171 and a plurality of drain electrodes 175 are formed on the ohmic contact stripes 161 and the ohmic contact islands 165, respectively, and on the gate insulation layer 140.

The data lines 171 transmit data signals and mainly extend in a vertical direction, thereby crossing the gate lines 121. Each data line 171 includes a plurality of source electrodes 173 extending toward the gate electrodes 124 and an end portion (not shown) with a wide area for connection with a different layer or an external driving circuit such as the data driving circuit 510. The end portion of the data line 171 and the data line 171 of the display area PA are connected through a second signal line 71 forming the second fan-out portion PB2.

The drain electrodes 175 are separated from the data lines 171 and face the source electrodes 173 with respect to the gate electrodes 124.

One gate electrode 124, one source electrode 173, and one drain electrode 175 constitute a thin film transistor (TFT) Q together with the projection 154 of the semiconductor stripe 151, and a channel of the TFT Q is formed at the projection 154 between the source electrode 173 and the drain electrode 175.

The ohmic contact stripes 161 exist only between the underlying semiconductor stripes 151 and the overlying data lines 171 and the ohmic contact islands 165 exist only between the underlying semiconductor projections 154 and the overlying drain electrodes 175, thereby reducing contact resistance therebetween. Some portions of each semiconductor stripe 151, including, for example, a portion between the source electrode 173 and the drain electrode 175, are exposed, without being covered by the data line 171 and the drain electrode 175.

Except for the exposed portions of the semiconductor projections 154, the ohmic contact stripes 161, the ohmic contact islands 165, the semiconductor stripes 151, the semiconductor projections 154, the data lines 171, and the drain electrodes 175 have the same plane shape. This is because the data line 171, the drain electrode 175, the semiconductor stripe 151, the semiconductor projection 154, the ohmic contact stripe 161, and the ohmic contact island 165 are formed by using a photosensitive film pattern having different thicknesses, and will be described through a manufacturing method. Accordingly, the ohmic contact stripe 161 and the semiconductor stripe 151 are maintained under the second signal line 71.

A passivation layer 180 is formed on the data lines 171, the drain electrodes 175, and the exposed portions of the semiconductor stripes 151. The passivation layer 180 may be made of an inorganic insulator such as silicon nitride or silicon oxide, an organic insulator, or an insulator having a low dielectric constant (a low-k material).

The passivation layer 180 has a plurality of contact holes 185 exposing the drain electrodes 175.

A plurality of pixel electrodes 191, a dummy pattern 7, and a sacrificial layer pattern 9 are formed on the passivation layer 180. The pixel electrode 191 and the dummy pattern 7 may be made of a transparent conductive material such as ITO or IZO, or a reflective metal such as aluminum, silver, or alloys thereof, and the sacrificial layer pattern 9 is made of an inorganic insulating material such as silicon nitride.

The pixel electrodes 191 are electrically connected to the respective drain electrodes 175 through the respective contact holes 185 to receive the data voltages from the drain electrodes 175. A pixel electrode 191 to which a data voltage is applied and a common electrode (not shown) of another corresponding display panel (not shown) that receives a common voltage, generate an electric field, thereby determining a direction of liquid crystal molecules of a liquid crystal layer 3 between the two electrodes. As the pixel electrode 191 and the common electrode form a capacitor (hereinafter referred to as a "liquid crystal capacitor"), an applied voltage is sustained even after the thin film transistor Q is turned off.

The pixel electrode 191 and a storage electrode line (not shown) overlap each other thereby forming a storage capacitor that enhances the capacity for maintaining the voltage of the liquid crystal capacitor.

The dummy pattern 7 that may be made of the same material as the pixel electrode 191 is respectively formed according to the first signal lines 21 of the first fan-out portion PB1 and the second signal lines 71 of the second fan-out portion PB2.

Also, the sacrificial layer pattern 9 is disposed on the passivation layer 180 in a region excluding the pixel electrode 191 and the dummy pattern 7. A first sacrificial layer pattern 9 is disposed between the first signal lines 21 and between the second signal lines 71, which are disposed in the peripheral area. A second sacrificial layer pattern 9 is disposed on the passivation layer 180 in a position overlapping the data lines 171 and the thin film transistors Q in the display area PA such that the second sacrificial layer pattern 9 defines respective openings in the region in which each pixel electrode 191 is disposed. That is, the second sacrificial layer pattern 9 encloses each pixel electrode.

The pixel electrode 191 and the dummy pattern 7 are spaced apart from the sacrificial layer pattern 9 by a gap S. A width of the gap S may be in a range from about 0.2 to 0.3 μm.

Next, a manufacturing method of the thin film transistor array panel shown in FIG. 2, FIG. 3, FIG. 4 and FIG. 5 according an exemplary embodiment of the present invention will be described with reference to FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, and FIG. 20 as well as FIG. 3, FIG. 4, and FIG. 5.

FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, FIG. 19, and FIG. 20 are cross-sectional views of a thin film transistor array panel in a manufacturing method of the thin film transistor array panel according to an exemplary embodiment of the present invention, FIG. 6, FIG. 9, FIG. 12, FIG. 15, and FIG. 18 are cross-sectional views taken along line III-III of FIG. 2. FIG. 7, FIG. 10, FIG. 13, FIG. 16, and FIG. 19 are cross-sectional views taken along line IV-IV of FIG. 1. FIG. 8, FIG. 11, FIG. 14, FIG. 17, and FIG. 20 are cross-sectional views taken along line V-V of FIG. 1.

Figure 6:
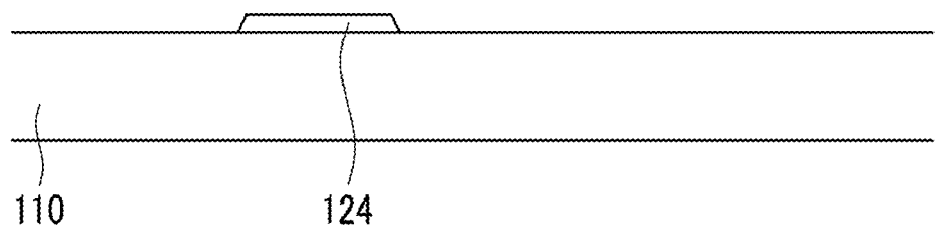
FIG. 6 is a cross-sectional view taken along line III-III of FIG. 2.
Figure 7:
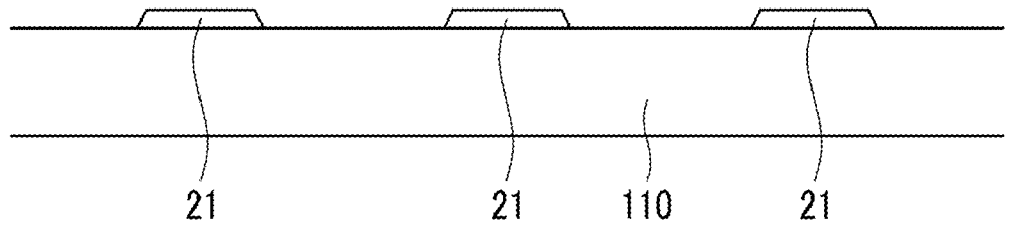
FIG. 7 is a cross-sectional view taken along line IV-IV of FIG. 1.
Figure 8:
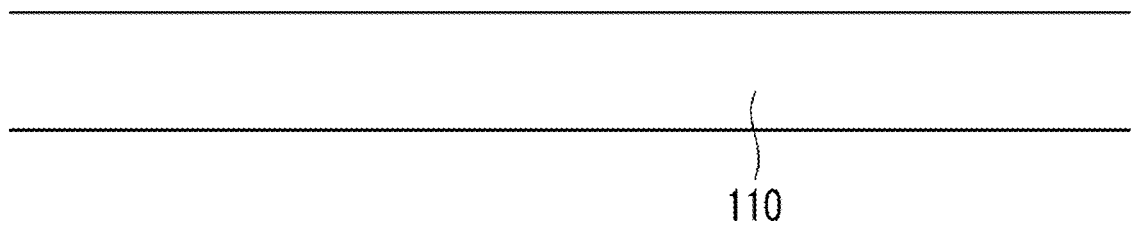
FIG. 8 is a cross-sectional view taken along line V-V of FIG. 1.

As shown in FIG. 6, FIG. 7 and FIG. 8, a metal layer is deposited on an insulation substrate 110 made of transparent glass or plastic, and is patterned to form a gate line including gate electrodes 124 and the first signal line 21.

Figure 9:
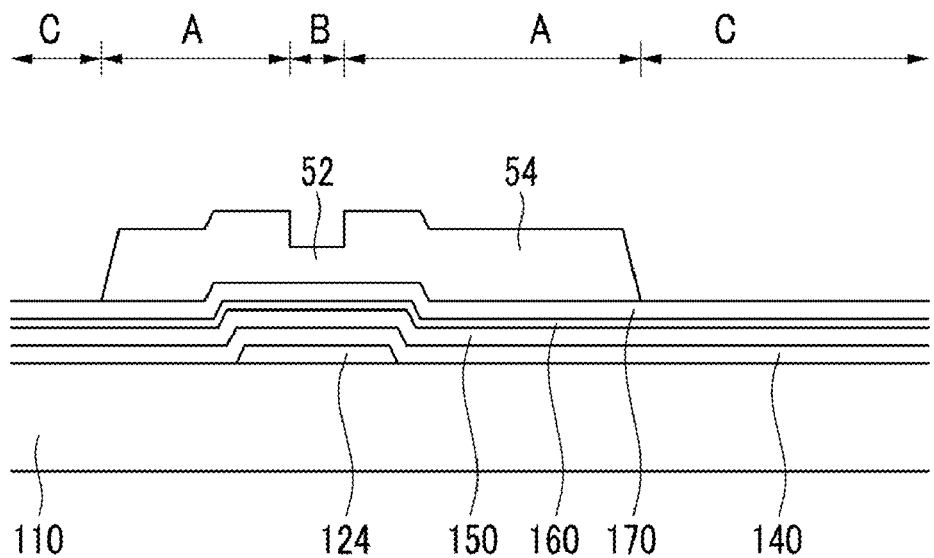
FIG. 9 is a cross-sectional view taken along line III-III of FIG. 2.
Figure 10:
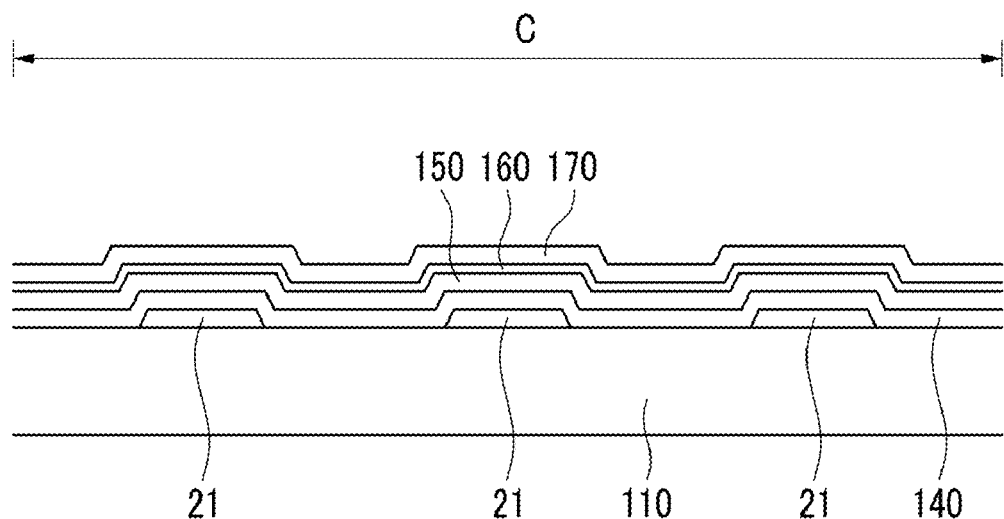
FIG. 10 is a cross-sectional view taken along line IV-IV of FIG. 1.
Figure 11:
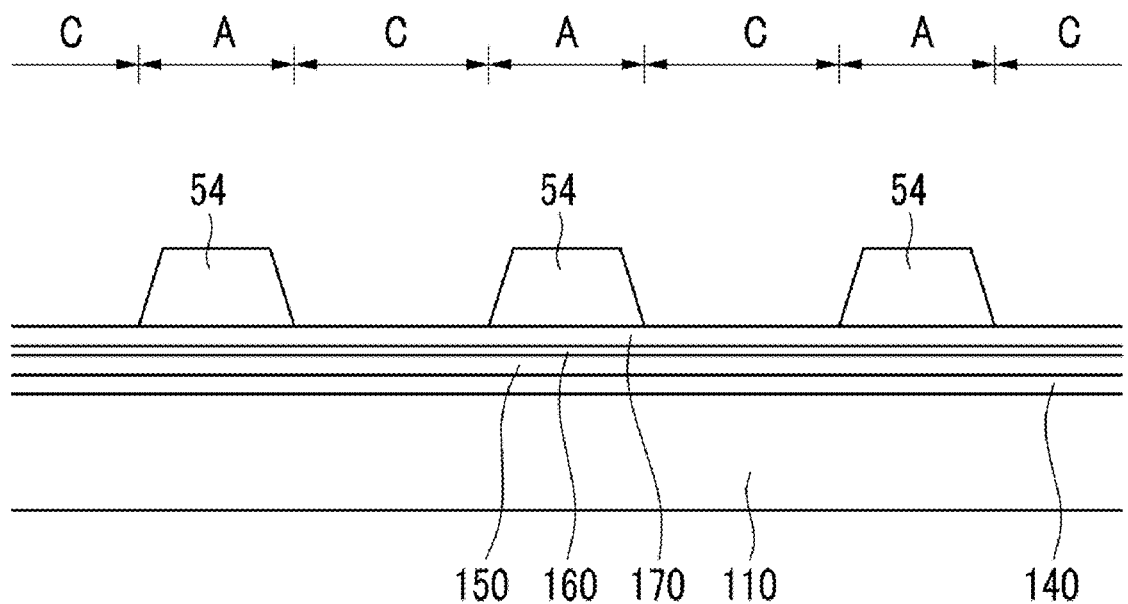
FIG. 11 is a cross-sectional view taken along line V-V of FIG. 1.

As shown in FIG. 9, FIG. 10, and FIG. 11, a gate insulating layer 140, an intrinsic amorphous silicon layer 150, and an impurity amorphous silicon layer 160 are deposited on the gate electrode 124 and the first signal line 21 by chemical vapor deposition (CVD). Next, a data metal layer 170 is deposited by sputtering.

A photosensitive film is coated on the metal layer 170, and is exposed and developed to form first photosensitive film patterns 52 and second photosensitive film patterns 54 having different thicknesses depending on position. The portions of the data metal layer 170, the impurity amorphous silicon layer 160, and the intrinsic amorphous silicon layer 150 corresponding to the wiring are a wiring portion A, portions thereof corresponding to the channel on the gate electrode 124 are a channel B, and a portion except for the wiring portion A and the channel portion B is a remaining portion C.

Among the photosensitive film patterns 52 and 54, the second photosensitive film pattern 54 corresponding to the wiring portion A is thicker than the first photosensitive film pattern 52 corresponding to the channel portion B, and the photosensitive film is removed on the remaining portion C. In this case, the thickness ratio of the first photosensitive film pattern 52 and the second photosensitive film pattern 54 may vary depending on etching process conditions (to be described), and preferably, the thickness of the first photosensitive film pattern 52 is half the thickness of the second photosensitive film pattern 54.

There may be various methods for forming the photosensitive pattern such that portions thereof have different thicknesses according to their positions, for which, for example, an exposure mask includes a transparent area, a light blocking area, and a semi-transparent area. The semi-transparent area includes a slit pattern, a lattice pattern, or a thin film having a median transmittance or having a median thickness. When the slit pattern is used, preferably, the width of the slits or the space between the slits is smaller than a resolution of a light exposer used for the photolithography. Another example of the method includes using a reflowable photosensitive film. That is, the method forms a thin portion by making a photosensitive film flow into a region where the photosensitive film is not present after forming the reflowable photosensitive film with a general exposure mask having only a light transmitting area and a light blocking area.

Figure 12:
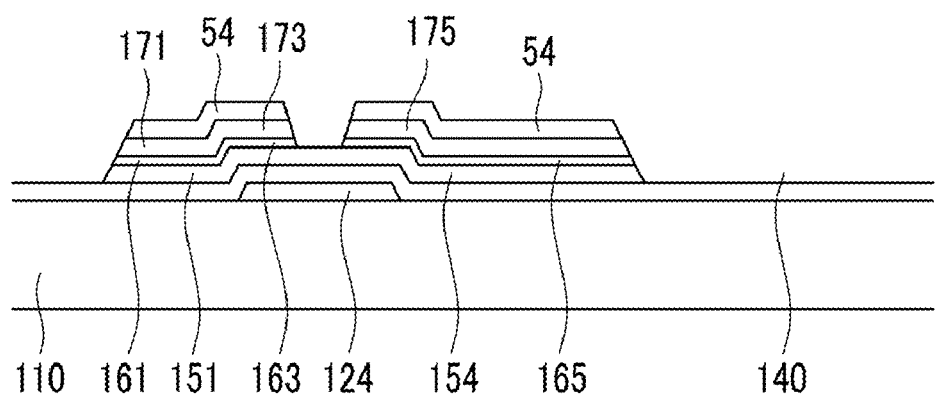
FIG. 12 is a cross-sectional view taken along line III-III of FIG. 2.
Figure 13:
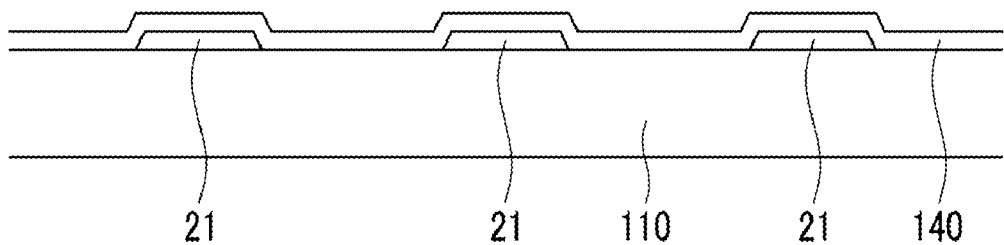
FIG. 13 is a cross-sectional view taken along line IV-IV of FIG. 1.
Figure 14:
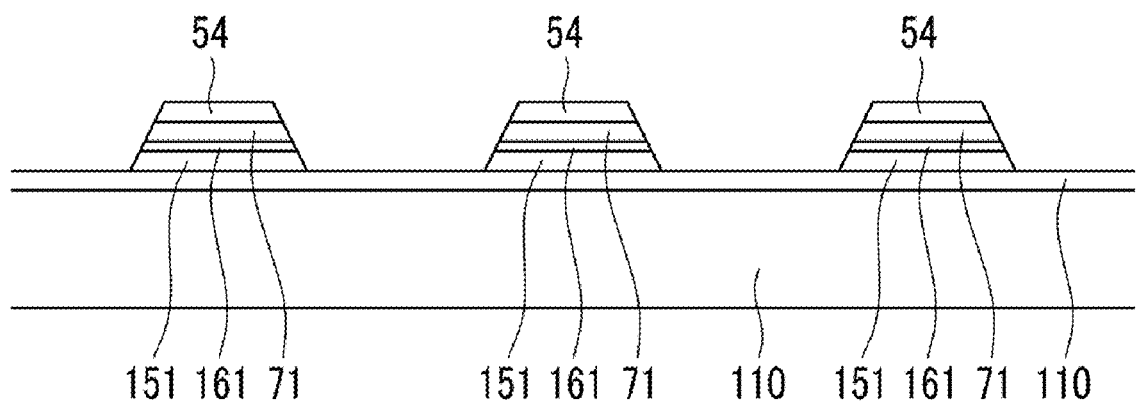
FIG. 14 is a cross-sectional view taken along line V-V of FIG. 1.

Next, as shown in FIG. 12, FIG. 13, and FIG. 14, the exposed lower layers 170, 160, and 150 are all etched by using the photosensitive film pattern 52 and 54 as an etching mask to form a data metal pattern, an ohmic contact layer pattern, and a semiconductor stripe 151.

An ashing process is executed to remove the thin first photosensitive film pattern 52. Here, the thickness of the thicker second photosensitive film pattern 54 is reduced. Next, the exposed data metal pattern and the ohmic contact pattern are etched by using the remaining photosensitive film pattern 54 as a mask to form the data line 171 including the source electrode 173, the second signal line 71 and the drain electrode 175, the ohmic contact stripes 161, and the ohmic contact islands 165.

The data line 171 and the drain electrode 175 have the same plane shape as the ohmic contact stripes 161 and the ohmic contact islands 165 and the semiconductor stripes 151 and the semiconductor projections 154, except for the exposed portion between the drain electrode 175 and the source electrode 173. Also, as shown in FIG. 14, the ohmic contact stripe 161 and the semiconductor 151 having the same plane shape as the second signal line 71 are formed thereunder. Accordingly, the signal line 71 connected to the data line 171 includes a lower layer made of the same material as the semiconductor stripes 151 and the semiconductor projections 154 and an upper layer disposed on the lower layer and made of the same material as the data line 171, that is, it includes the ohmic contact stripes 161 and the ohmic contact islands 165.

Also, as shown in FIG. 13, the layers disposed on the first signal line 21 are all removed such that the gate insulating layer 140 is exposed.

Figure 15:
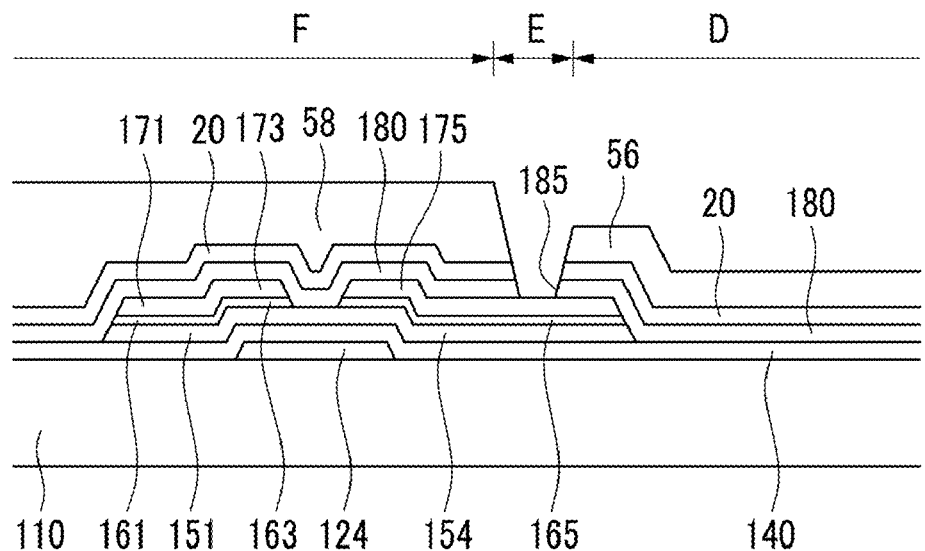
FIG. 15 is a cross-sectional view taken along line III-III of FIG. 2.
Figure 16:
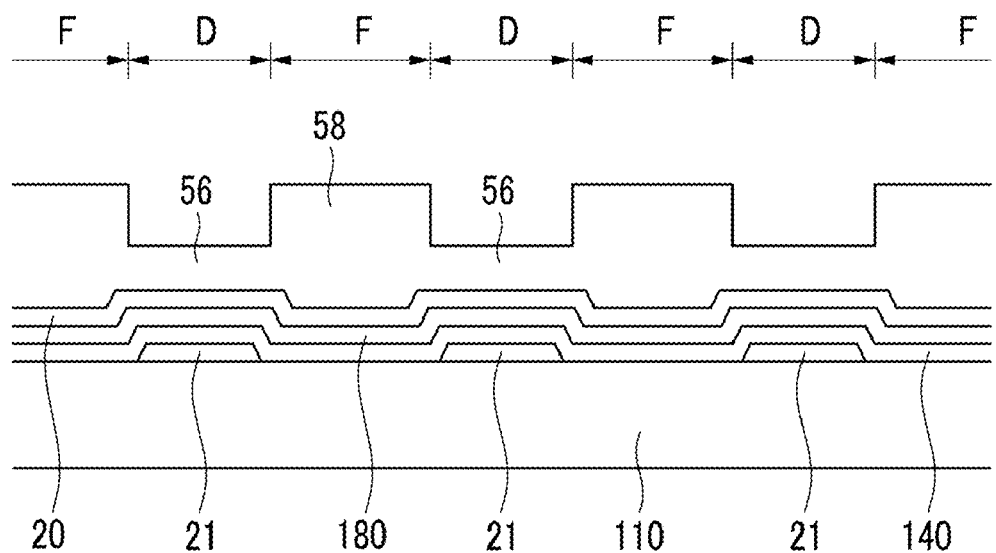
FIG. 16 is a cross-sectional view taken along line IV-IV of FIG. 1.
Figure 17:
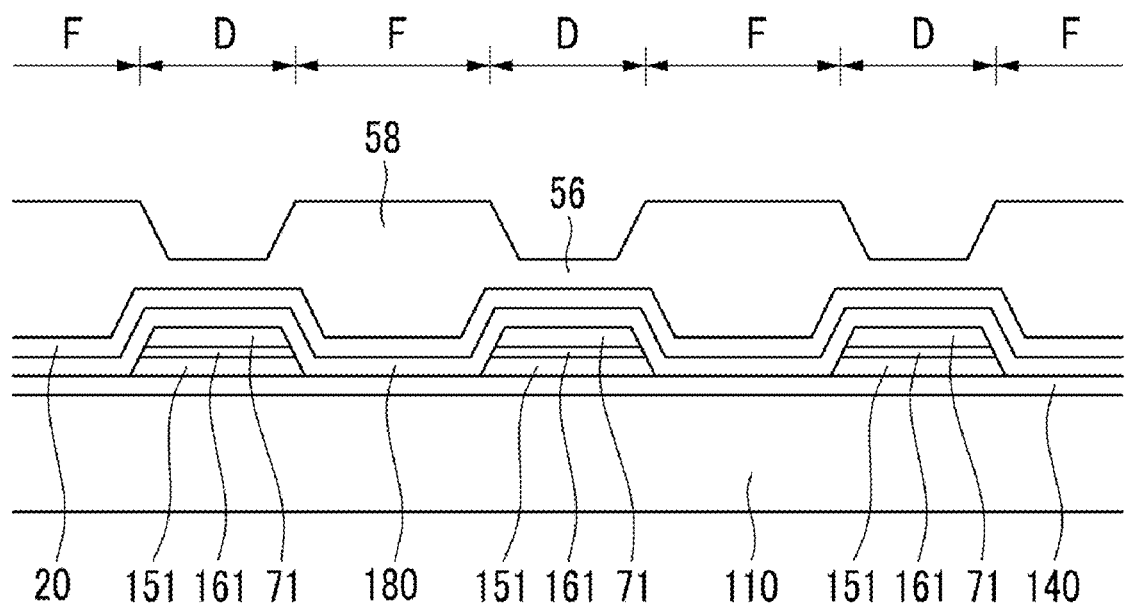
FIG. 17 is a cross-sectional view taken along line V-V of FIG. 1.

As shown in FIG. 15, FIG. 16, and FIG. 17, a passivation layer 180 and a sacrificial layer 20 covering the exposed projection 154 of the semiconductor 151 are formed.

Next, photosensitive film patterns 56 and 58 are formed on the passivation layer 180 and the sacrificial layer 20. The photosensitive film patterns 56 and 58 may have different thicknesses depending on the positions similar to the photosensitive film patterns 52 and 54 shown in FIG. 9, FIG. 10, and FIG. 11, however the photosensitive film patterns 56 and 58 are formed by using a mask including a semi-transparent layer in FIG. 15, FIG. 16, and FIG. 17.

The slit pattern using diffraction between the slits has a larger process margin for forming the pattern compared with the mask having the semi-transparent layer. Accordingly, it is preferable to use the mask including the semi-transparent layer compared with the mask including the slit pattern, to thereby reduce the interval between the wiring in regions where the signal lines are densely arranged, such as the fan-out portions.

For convenience of explanation, the portions of the sacrificial layer 20 and the passivation layer 180 corresponding to the pixel electrode 191, the first signal line 21 and the second signal line 71 are referred to collectively as a conductive layer portion D. The portions of the sacrificial layer 20 and the passivation layer 180 corresponding to the contact hole 185 are referred to as a contact hole portion E, and the portions except for the conductive layer portion D and the contact hole portion E are referred to as a remaining portion F.

Among the photosensitive film pattern 56 and 58, the photosensitive film pattern 58 of the remaining portion F is thicker than the photosensitive film pattern 56 of the conductive layer portion D. In the contact hole portion E, the photosensitive film pattern is not formed.

Next, the sacrificial layer 20 and the passivation layer 180 that are exposed on the contact hole portion E are etched by using the photosensitive film patterns 56 and 58 as a mask to form a contact hole 185 exposing the drain electrode 175.

Next, an ashing process is executed to remove the photosensitive film pattern 56 of the conductive layer portion D, thereby exposing the underlying sacrificial layer 20. Here, a portion of the upper portion of the photosensitive film pattern 58 at the remaining portion F is also etched.

Figure 18:
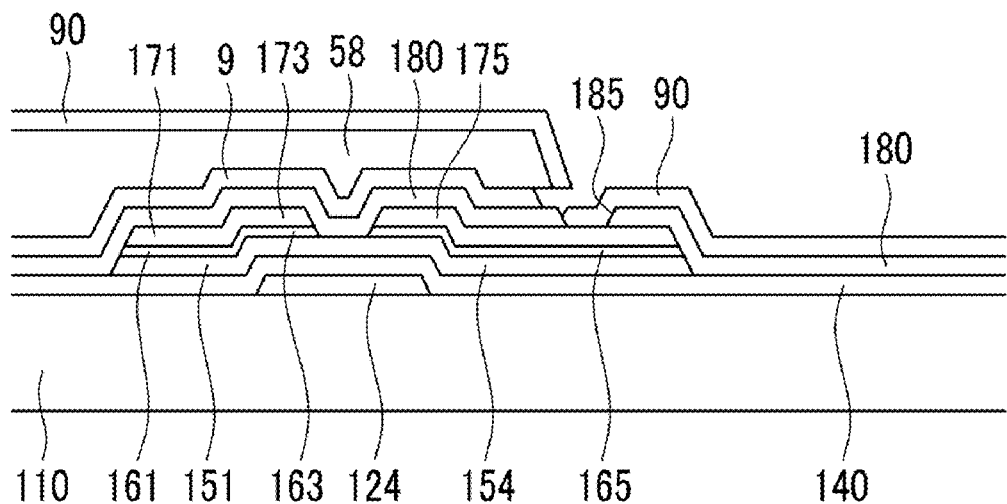
FIG. 18 is a cross-sectional view taken along line III-III of FIG. 2.
Figure 19:
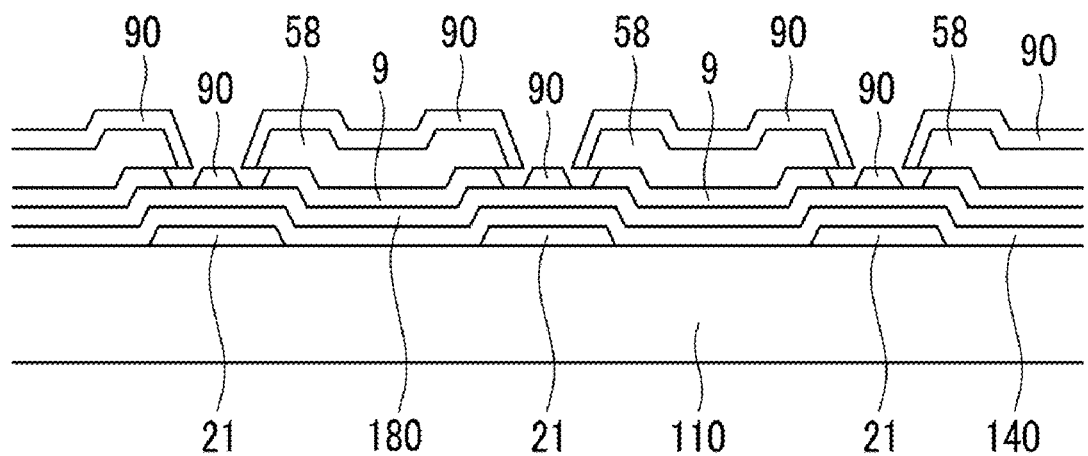
FIG. 19 is a cross-sectional view taken along line IV-IV of FIG. 1.
Figure 20:
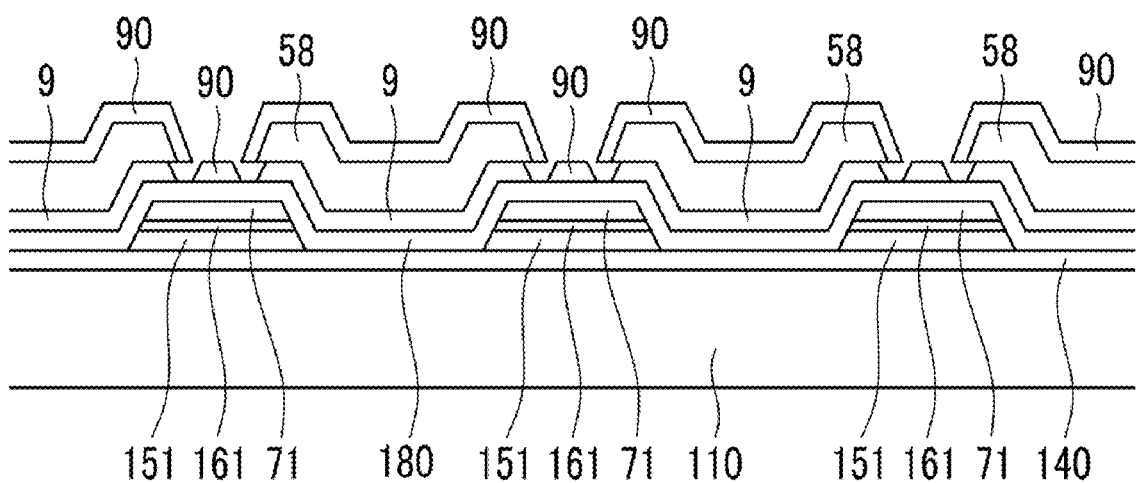
FIG. 20 is a cross-sectional view taken along line V-V of FIG. 1.

Next, as shown in FIG. 18, FIG. 19, and FIG. 20, the exposed sacrificial layer is removed by using the photosensitive film pattern 58 as a mask to form the sacrificial layer pattern 9.

When forming the sacrificial layer pattern 9, the portion of the sacrificial layer 20 under the photosensitive film pattern 58 is over-etched such that an undercut is formed under the edge of the photosensitive film pattern 58. The undercut may be formed with a minimum size for a transparent conductive layer 90 that will be formed later to be disconnected such that an etchant can penetrate. In an exemplary embodiment of the present invention, it is preferable that the size of the undercut is in the range from about 0.2 to 0.3 μm.

Next, a transparent conductive material such as ITO or IZO is deposited on the photosensitive film pattern 58, the exposed drain electrode 175 and the passivation layer 180 to form the transparent conductive layer 90. When forming the transparent conductive layer 90, it is disconnected at the undercut of the photosensitive film pattern 58.

Referring to FIG. 2, FIG. 3, FIG. 4, and FIG. 5, in the final structure, the undercut results in a corresponding gap S spacing apart the pixel electrode 191 from the sacrificial layer pattern 9, and spacing apart the dummy pattern 7 from the sacrificial layer pattern 9.

Referring to FIG. 2, the sacrificial layer pattern 9 encloses the pixel electrode 191 via the gap S, and is disposed between two neighboring pixel electrodes 191.

Next, as shown in FIG. 3, FIG. 4, and FIG. 5, the photosensitive film pattern 58 is removed through a lift-off method to form the pixel electrode 191 and the dummy pattern 7. That is, if an etchant for removing the photosensitive film pattern 58 is applied, the photosensitive film pattern 58 is etched through the disconnected portion of the transparent conductive layer 90, and then the overlying transparent conductive layer 90 is removed while the photosensitive film pattern 58 is lifted off to expose the sacrificial layer 9. Accordingly, referring to FIG. 3, FIG. 15, and FIG. 18, the contact hole portion E and the conductive layer portion D among the remaining transparent conductive layer 90 is formed as the pixel electrode 191, and the remaining portion F is formed as the second sacrificial layer pattern 9 surrounding the pixel electrodes 191. The pixel electrode 191 is connected to the drain electrode 175 through the contact hole 185. Referring to FIG. 4, FIG. 16, and FIG. 19, the conductive layer portion D among the remaining transparent conductive layer 90 is formed as the dummy pattern 7, and the remaining portion F is formed as the first sacrificial layer pattern 9 between the first signal lines 21. Referring to FIG. 5, FIG. 17, and FIG. 20, the conductive layer portion D among the remaining transparent conductive layer 90 is formed as the dummy pattern 7, and the remaining portion F is formed as the first sacrificial layer pattern 9 between the second signal lines 71.

In the lift-off process, if the layer between the first signal lines 21 and the layer between the second signal lines 71 is removed after the entire exposure without the use of the photosensitive film 56 and 58 having the different thicknesses, the interval between the first signal lines 21 and the interval between the second signal lines 71 must be about 10 µm considering the process margin. However, in the exemplary embodiment of the present invention, when the photosensitive film pattern 56 and 58 has the different thicknesses, the interval may be reduced to less than 5 µm such that the region occupied with the fan-out portion PB1 and PB2 may be reduced. Accordingly, the width of a light blocking member (not shown) formed in the fan-out portion PB1 and PB2 may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a thin film transistor array panel, comprising:
    forming a gate line and a first signal line to connect the gate line to a driving circuit on a substrate;
    forming a semiconductor on the gate line;
    forming a data line and a drain electrode on the semiconductor;
    forming a second signal line to connect the data line to the driving circuit;
    forming a passivation layer and a sacrificial layer on the data line, the drain electrode, the first signal line, and the second signal line;
    forming a photosensitive film pattern comprising a first portion and a second portion of different thicknesses on the sacrificial layer;
    etching the sacrificial layer and the passivation layer using the photosensitive film pattern as a mask to form a contact hole exposing the drain electrode;
    removing the exposed sacrificial layer after removing the first portion of the photosensitive film pattern, and forming an undercut under the second portion of the photosensitive film pattern;
    forming a transparent conductive layer on the second portion of the photosensitive film pattern, the exposed drain electrode, and the passivation layer; and
    removing the second portion of the photosensitive film pattern disposed under the transparent conductive layer thereby removing the transparent conductive layer disposed on the second portion of the photosensitive film pattern among the transparent conductive layer to form a pixel electrode and a dummy pattern.

2. The method of claim 1, wherein the photosensitive film pattern is formed using a semi-transparent layer.

3. The method of claim 1, wherein the first portion of the photosensitive film pattern corresponds to the pixel electrode, the first signal line, and the second signal line, and the second portion of the photosensitive film pattern corresponds to the portion between first signal lines, and between second signal lines and on the gate line and the data line.

4. The method of claim 1, wherein the undercut is formed with a depth of 0.2-0.3 µm.

5. The method of claim 1, wherein the forming of the semiconductor and the forming of the data line and the drain electrode are performed using another photosensitive film pattern comprising two portions with different thicknesses.

6. The method of claim 1, wherein the sacrificial layer comprises silicon nitride.

* * * * *